United States Patent
Huang et al.

(10) Patent No.: US 9,840,767 B2
(45) Date of Patent: Dec. 12, 2017

(54) MANUFACTURING METHOD FOR A HEAD SLIDER COATED WITH DLC

(71) Applicant: SAE MAGNETICS (H.K.) LTD., Hong Kong (CN)

(72) Inventors: Jian Hui Huang, Hong Kong (CN); Xiao Ke Ding, Hong Kong (CN); Hong Tao Ma, Hong Kong (CN); Ryuji Fujii, Hong Kong (CN); Da Yao He, Hong Kong (CN); De Jin Fan, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 0 days.

(21) Appl. No.: 15/089,648

(22) Filed: Apr. 4, 2016

(65) Prior Publication Data
US 2017/0283939 A1    Oct. 5, 2017

(51) Int. Cl.
C23C 14/34 (2006.01)
C23C 14/06 (2006.01)
C23C 14/58 (2006.01)

(52) U.S. Cl.
CPC .......... *C23C 14/34* (2013.01); *C23C 14/0611* (2013.01); *C23C 14/588* (2013.01); *C23C 14/5873* (2013.01)

(58) Field of Classification Search
CPC . C23C 14/34; C23C 14/0611; C23C 14/5873; C23C 14/588
See application file for complete search history.

(56) References Cited

U.S. PATENT DOCUMENTS

| 5,203,798 A * | 4/1993 | Watanabe | B08B 3/12 134/122 R |
| 2007/0127158 A1* | 6/2007 | Tran | G11B 5/718 360/134 |
| 2009/0029068 A1* | 1/2009 | Kanazawa | C23C 14/025 427/577 |
| 2013/0280522 A1* | 10/2013 | Cao | C23C 14/0605 428/336 |

FOREIGN PATENT DOCUMENTS

JP    2002-279605    9/2002

* cited by examiner

*Primary Examiner* — Duy Deo
(74) *Attorney, Agent, or Firm* — Nixon & Vanderhye PC

(57) ABSTRACT

A manufacturing method for a head slider coated with Diamond-like Carbon (DLC) includes: providing a substrate that is to be finally made into a head slider; depositing a DLC layer on a surface of the substrate, with carbon plasma source being sputtered in a direction that is vertical to the surface of the substrate; and doping a fluorine-doping (F-doping) layer on the DLC layer. Whereby the head slider has good film adhesion performance, higher hardness, better wear resistance, lower surface energy to obtain good hydrophobicity and oleophobicity, and lower fly height in HDD.

9 Claims, 3 Drawing Sheets

MANUFACTURING METHOD FOR A HEAD SLIDER COATED WITH DLC

FIELD OF THE INVENTION

The present invention relates to the field of magnetic head manufacturing, and more particularly to a manufacturing method for a head slider coated with diamond-like carbon (DLC) which is used in hard disk drive (HDD).

BACKGROUND OF THE INVENTION

As a rule, a protective film for preventing wear is formed on the surface of a magnetic head for use in a hard disk drive or the like (see, e.g. Japanese Application Publication No. 2002-279605). In a technique described in this document, a silicon film is formed on a substrate of the magnetic head by a sputtering process, a DLC film is formed on the silicon film by a CVD process, and a ta-C film is formed on the DLC film by a filtered cathodic vacuum arc (FCVA) process.

Additionally, a silicon film is formed as a contact layer on an air bearing surface (ABS) of the magnetic head, and a protective film is formed on the silicon film by FCVA process in some case. In this case, when a high bias voltage is applied in order to enhance hardness, the silicon film is mixed with a carbon film, and Si moves toward a surface of the magnetic head, which degrades the wear resistance. Further, the surface energy of the above overcoat layer is high due to the bigger silicon atom dimension will lead bigger distortion or stress in DLC film. In addition, such overcoat layer with multiple films has thicker thickness which will increase fly height of the magnetic head to weaken the performance of HDD.

Therefore there is a need for an improved manufacturing method of a head slider coated with DLC to overcome the above-mentioned drawbacks.

SUMMARY OF THE INVENTION

One aspect of the present invention is to provide a manufacturing method for a head slider coated with DLC, thereby the head slider has good film adhesion performance, higher hardness, better wear resistance, lower surface energy to obtain good hydrophobicity and oleophobicity, and lower fly height in HDD.

To achieve above objective, a manufacturing method for a head slider coated with Diamond-like Carbon (DLC) includes: providing a substrate that is to be finally made into a head slider; depositing a DLC layer on a surface of the substrate, with carbon plasma source being sputtered in a direction that is vertical to the surface of the substrate; and doping a fluorine-doping (F-doping) layer on the DLC layer.

Preferably, the method further includes cleaning the substrate by means of ion beam etching (IBE) process.

More preferably, before cleaning the substrate by means of IBE process, the method further includes pre-cleaning the substrate by means of ultrasonic waves.

As an embodiment of the present invention, said doping an F-doping layer on the DLC layer comprises doping the F-doping layer by means of ion beam etching (IBE) process or electron cyclotron resonance (ECR) process.

Preferably, said doping an F-doping layer on the DLC layer comprises: using carbon tetrafluoride ($CF_4$) as doping gas, and controlling the $CF_4$ flux ranging from 40 sccm to 60 sccm.

Preferably, said doping an F-doping layer on the DLC layer further comprises: rotating the substrate in a predetermined speed and applying 0V bias voltage to an anode, during the deposition.

Preferably, the DLC layer has a thickness ranging from 12 Å-30 Å.

Preferably, the F-doping layer has a thickness ranging from 2 Å-6 Å.

Preferably, the DLC layer is deposited by means of filtered cathodic vacuum arc (FCVA) process, physical vapor deposition (PVD) process or electron cyclotron resonance (ECR) process.

Compared with the prior art, the DLC layer is deposited on the substrate, with the carbon plasma source is sputtered in a direction that is vertical to the surface of the substrate, thus the DLC layer is harder and compacter to improve the wear resistance; and the F-doping layer is formed on the DLC layer, thus the DLC layer with F-doping layer can be firmly attached to the surface of the head slider to improve adhesion performance, and the surface energy of the head slider is reduced to obtain the good hydrophobicity and oleophobicity. Furthermore, the thickness of the layers is thin to obtain lower fly height in HDD to improve the reading and writing operations.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
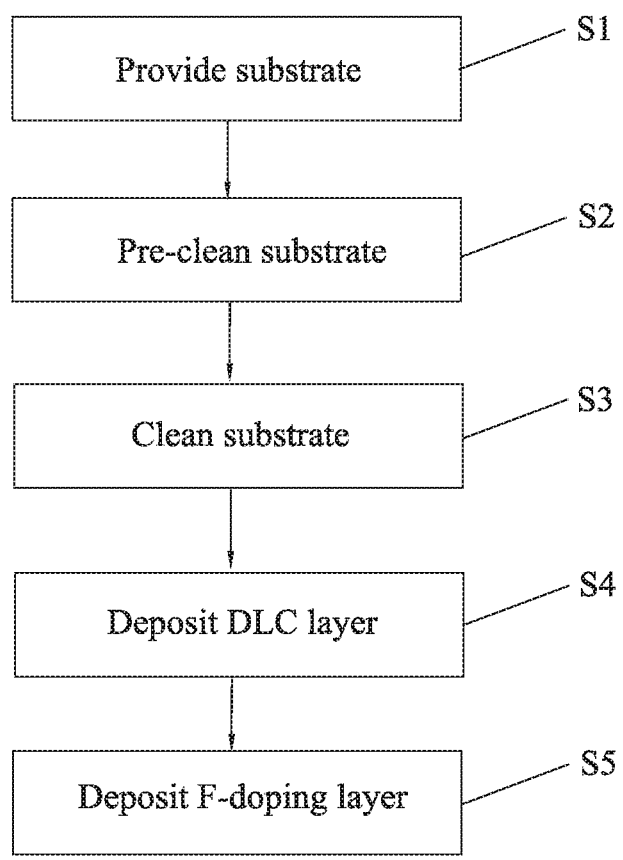
FIG. 1 is a flowchart of a manufacturing method for a head slider coated with DLC according to one embodiment of the present invention.

Various preferred embodiments of the invention will now be described with reference to the figures, wherein like reference numerals designate similar parts throughout the various views. As indicated above, the invention is directed to a manufacturing method for a head slider coated with DLC, whereby the head slider has good film adhesion performance, higher hardness, better wear resistance, lower surface energy to obtain good hydrophobicity and oleophobicity, and lower fly height in HDD.

A manufacturing method for a head slider coated with DLC according to the present invention will be described in detailed by combination with FIGS. 1 to 3. As shown in FIG. 1, the method includes the following steps.

S1, providing a substrate that is to be finally made into a head slider;

S2, pre-cleaning the substrate;

S3, cleaning the substrate;

S4, depositing a DLC layer on a surface of the substrate, with carbon plasma source being sputtered in a direction that is vertical to the surface of the substrate; and S5, doping a fluorine-doping (F-doping) layer on the DLC layer.

Figure 2A:
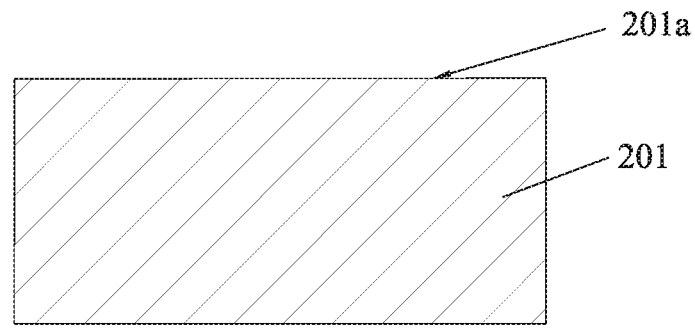
FIGS. 2a-2c are schematic views showing steps of making the head slider according to the present invention.
Figure 2B:
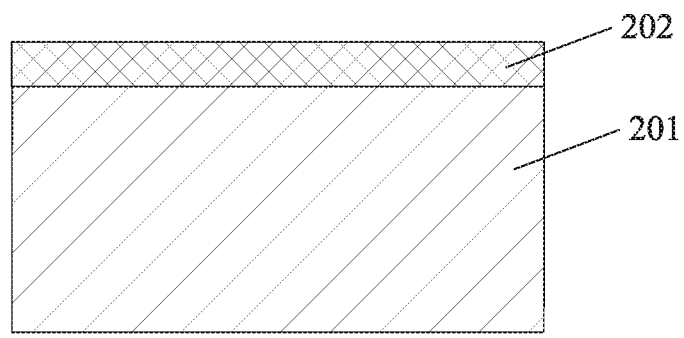
Figure 2C:
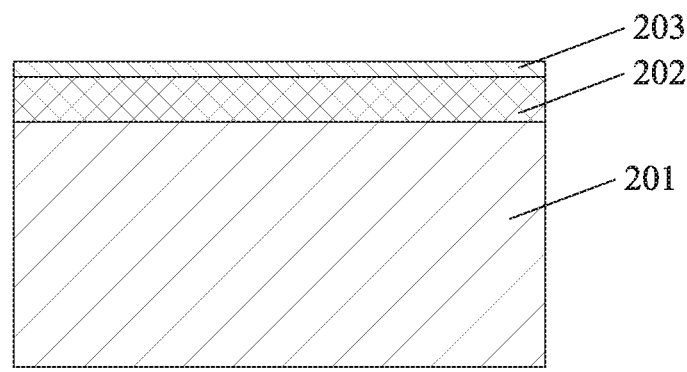
Figure 3:
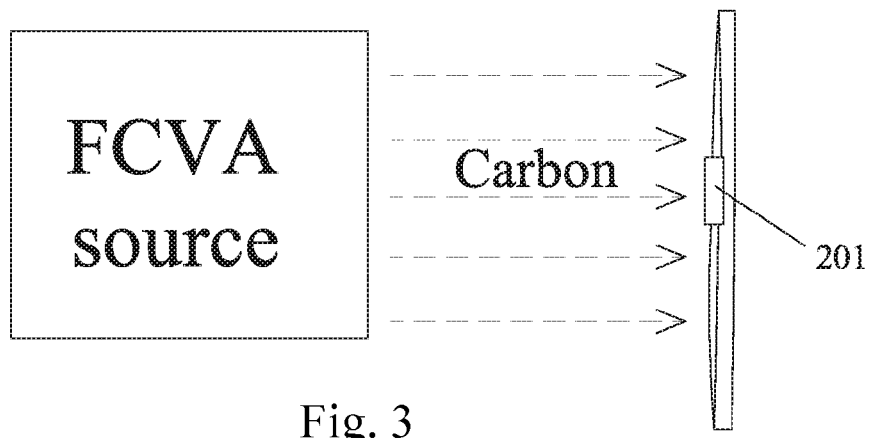
FIG. 3 is a schematic view showing a step of making the DLC layer on the surface of the head slider.

As shown in the FIGS. 2a-2c, the substrate 201 can be a row bar or wafer with row bars, or an individual head slider that is cut off. The substrate 201 has an air bearing surface (ABS) 201a. In the step S2, ultrasonic waves are applied to clean the substrate 201, and N-methylpyrrolidone (NMP) and Isopropanol (IPA) are taken as the cleaning solution, with cleaning time is about 30 min. After the ultrasonic wave cleaning, the substrate 201 is dried naturally. In the step S3, ion beam etching (IBE) process is applied to make the substrate 201 more cleaner to benefit the perfect deposition process. Usually plasma of Argon, mix-gas Argon and Oxygen, mix-gas Argon and ethane, Nitrogen and Helium are applied for cleaning.

Figure 4:
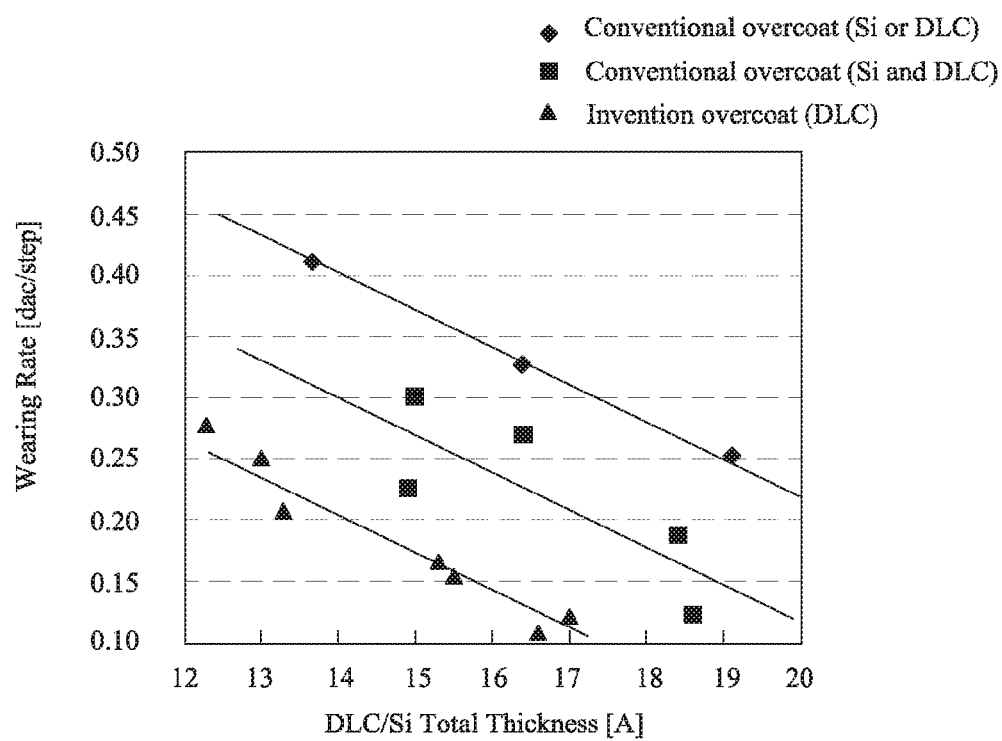
FIG. 4 is a diagram showing the compared wearing rate.

And then in the step S4, the DLC layer 202 is deposited on the ABS 201a, by means of filtered cathodic vacuum arc (FCVA) process, physical vapor deposition (PVD) process or electron cyclotron resonance (ECR) process. Specifically, as shown in FIG. 3, the DLC layer 202 is deposited by means of FCVA, and the target is carbon with high purity. The carbon plasma source is sputtered in a direction that is vertical to the ABS 201a of the substrate 201, in such a way, the DLC layer 202 formed on the ABS 201a has improved hardness and improved wear resistance, because DLC ion has higher energy in vertical direction of the ABS 201 of the row bar or slider. FIG. 4 shows wearing rates of HDD, by comparison with the present invention and the prior arts. As shown, the DLC layer 202 according to the invention has the smallest wearing rate.

Preferably, the uniform and dense DLC layer 202 could be made by rotating the substrate 201 during the deposition. Preferably, the DLC layer 202 has a thickness ranging from 12 Å-30 Å.

And then in the step S5, the F-doping layer 203 is formed on the DLC layer 202 by IBE process or ECR process. Specifically, the doping gas is $CF_4$, and the $CF_4$ flux is in a range from 40 sccm to 60 sccm, and the doping time is in a range from 10 min to 20 min. In this embodiment, the thickness of the F-doping layer is in a range of 2 Å-6 Å. Due to the F irons are formed on the surface of the DLC layer 202, thus C—F bonds which have good hydrophobic and oleophobic properties are formed on the surface of the DLC layer 202. Preferably, during the deposition of the F-doping layer 203, no bias voltage is applied to the anode so as to avoid the removal of the DLC layer.

In conclusion, the DLC layer 202 is deposited on the substrate 201, with the carbon plasma source is sputtered in a direction that is vertical to the surface of the substrate 201, thus the DLC layer 202 is harder and compacter to improve the wear resistance; and the F-doping layer 203 is formed on the DLC layer 202, thus the DLC layer 202 with F-doping layer 203 can be firmly attached to the surface of the head slider 201 to improve adhesion performance, and the surface energy of the head slider is reduced to obtain the good hydrophobicity and oleophobicity. Furthermore, the thickness of the layers is thin to obtain lower fly height in HDD to improve the reading and writing operations finally.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A manufacturing method for a head slider coated with Diamond-like Carbon (DLC), comprising:
   providing a substrate that is to be finally made into a head slider;
   depositing a DLC layer on a surface of the substrate, with carbon plasma source being sputtered in a direction that is vertical to the surface of the substrate; and
   forming fluorine ions on a top surface of the DLC layer to form a fluorine-doping (F-doping) layer on the DLC layer, while a 0V bias voltage is being applied to an anode of the substrate.

2. The manufacturing method according to claim 1, further comprising cleaning the substrate by means of an ion beam etching (IBE) process.

3. The manufacturing method according to claim 2, further comprising, before cleaning the substrate by means of the IBE process, pre-cleaning the substrate by means of ultrasonic waves.

4. The manufacturing method according to claim 1, wherein said forming an F-doping layer on the DLC layer comprises forming the F-doping layer by means of an ion beam etching (IBE) process or an electron cyclotron resonance (ECR) process.

5. The manufacturing method according to claim 1, wherein said forming an F-doping layer on the DLC layer comprises: using carbon tetrafluoride ($CF_4$) as doping gas, and controlling the $CF_4$ flux ranging from 40 sccm to 60 sccm.

6. The manufacturing method according to claim 5, wherein said forming an F-doping layer on the DLC layer further comprises: rotating the substrate in a predetermined speed and applying the 0V bias voltage to the anode, during the deposition.

7. The manufacturing method according to claim 1, wherein the DLC layer has a thickness ranging from 12 Å~ to 30 Å.

8. The manufacturing method according to claim 1, wherein the F-doping layer has a thickness ranging from 2 Å~ to 6 Å.

9. The manufacturing method according to claim 1, wherein the DLC layer is deposited by means of a filtered cathodic vacuum arc (FCVA) process, a physical vapor deposition (PVD) process or an electron cyclotron resonance (ECR) process.

* * * * *